United States Patent [19]

Park

[11] Patent Number: 5,795,808
[45] Date of Patent: Aug. 18, 1998

[54] METHOD FOR FORMING SHALLOW JUNCTION FOR SEMICONDUCTOR DEVICE

[75] Inventor: Bo Hyun Park, Kyoungki-do, Rep. of Korea

[73] Assignee: Hyundai Electronics Industries C., Ltd., Kyoungki-do, Rep. of Korea

[21] Appl. No.: 744,154

[22] Filed: Nov. 12, 1996

[30] Foreign Application Priority Data

Nov. 13, 1995 [KR] Rep. of Korea ............... 95-41042

[51] Int. Cl.⁶ .................... H01L 21/336; H01L 21/265
[52] U.S. Cl. .................. 438/301; 438/533; 438/586; 438/655
[58] Field of Search ...................... 438/233, 530, 438/533, 649, 655, 656, 683, 360, 299, 301, 586

[56] References Cited

U.S. PATENT DOCUMENTS

| | | | |
|---|---|---|---|
| 4,310,568 | 1/1982 | Howard et al. | 427/84 |
| 4,870,033 | 9/1989 | Hotta et al. | 438/655 |
| 5,041,394 | 8/1991 | Spratt et al. | 438/655 |
| 5,217,924 | 6/1993 | Rodder et al. | 438/533 |
| 5,510,295 | 4/1996 | Cabral, Jr. et al. | 438/656 |
| 5,620,926 | 4/1997 | Itoh | 438/530 |

OTHER PUBLICATIONS

Murarka, S., "Refractory Silicides for Integrated Circuits", J. Vac. Sci. Technol., 17(4), Jul./Aug. 1980, pp. 775-792, Jul./Aug. 1980.

Wolf, S., et al., Silicon Processing, vol. 1, Lattice Press, 1986, pp. 384-399, 1986.

*Primary Examiner*—T. N. Quach
*Attorney, Agent, or Firm*—Gary M. Nath; Nath & Associates

[57] ABSTRACT

A method for forming a shallow junction of a semiconductor device using a zirconium film to cover a semiconductor substrate and implanting impurities into the zirconium film. A titanium film is then formed over the zirconium film and both the zirconium and the titanium films are subjected to a thermal treatment to form a zirconium silicide and a titanium silicide. Unreacted parts of the zirconium film and titanium film are removed and the zirconium and titanium silicides are then subject to a second thermal treatment.

22 Claims, 4 Drawing Sheets

METHOD FOR FORMING SHALLOW JUNCTION FOR SEMICONDUCTOR DEVICE

BACKGROUND OF THE INVENTION

1. Field of the invention

The present invention relates, in general, to a method for forming a shallow junction of a semiconductor device and, more particularly, to a method for forming a shallow junction, which brings about a significant improvement in the high integration of a semiconductor device.

2. Description of the Prior Art

As the integration degree of a semiconductor device is required to be high, the formation of shallow junction becomes a very important process in fabricating a semiconductor device because the lateral diffusion from the source/drain region of a transistor causes a decrease in effective electrode length. Further, the lateral diffusion affects transistor characteristics, such as punch-through and the extent thereof which is proportional to the junction depth. Therefore, shallow junction brings about an effect of reducing the short channel effect. That is, shallow junction can lead to a reduction in face resistance, contact resistance and leakage current, which is required for a highly integrated semiconductor device. For example, for a highly integrated semiconductor device of 256M DRAM or more requiring a junction leakage current less than 10 nA/cm$^2$ and a junction face resistance less than 100 Ω/cm$^2$, n$^+$/p junction is required to be 0.1 μm or less in depth while p$^+$/n junction may have a depth less than 0.15 μm.

To form a shallow junction, a low energy ion implantation process is generally used in which dopants are lightly implanted in a silicon substrate with a low energy, e.g. 10 KeV or less, at an early stage. However, this technique is difficult to apply, in practice, for device because ion beam current is very small with very low energy. Furthermore, diffusion of the dopants occurs upon thermal treatment subsequent to the ion implantation, inhibiting the formation of shallow junction.

Another conventional technique for forming a shallow junction is to prevent channeling at an early stage, thereby locating ions near the surface of a silicon substrate. According to this technique, termed initial amorphous process, ions with relatively large mass, such as arsenic (As), silicon (Si) and germanium (Ge), are implanted to make a silicon substrate fully amorphous, thereby completely preventing the channelling of the implanted ions. This initial amorphous layer is converted into a silicon crystalline layer by a thermal treatment subsequent to the ion implantation. However, extended defects are generated below the interface between the initial amorphous layer and the silicon crystalline layer owing to an excess of Si self interstitial defects resulting from ion implantation. Moreover, the ions implanted are deeply diffused by the action of such defects, which leads to a reduction the effect of preventing the channeling. In addition, the extended defects give rise to an increase of junction leakage current.

Another formation technique of shallow junction is to carry out a thermal treatment at a low temperature after ion implantation. This conventional technique has a significant problem in that the temperature and time of thermal treatment is limitedly reduced owing to planarization of subsequent oxide film. Furthermore, the dopants become inactive and defect removal is weakened, so that face resistance and junction leakage current increase.

Another conventional technique comprises the formation a titanium silicide film over a gate and a source/drain with the aim of minimizing the resistance of the gate and the source/drain. In this regard, a description will be given of the prior art, in connection with some drawings, in order to better understand the background of the invention.

Referring to FIGS. 1 to 4, a conventional method for forming a shallow junction of a semiconductor device is in schematic form described.

As shown in FIG. 1, a well 2 is formed in a predetermined region of a silicon substrate 1, using an ion implantation mask, after which an element isolation film 3 is formed in an element isolation region, followed by the formation of a gate oxide film 4 over the exposed silicon substrate 1. A polysilicon layer is deposited over the gate oxide film 4 and selectively etched to form a gate electrode 5 at the side wall at which an oxide spacer 6 is, then, formed.

Using the element isolation film 3, the gate electrode 5 and the oxide spacer 6 as a mask, arsenic (As) or boron fluoride (BF$_2$) ions, depending on the type of the silicon substrate 1, are selectively implanted into exposed regions of the silicon substrate 1, to create an n$^+$ or p$^+$ type source/drain junction 7. At this time, a certain thickness of residual oxide film (not shown) is formed over the junction 7. Since arsenic (As) or boron fluoride (BF$_2$) ions implanted through the residual oxide film, channeling is prevented and the damage of semiconductor substrate attributed to ion implantation, is reduced. Then, a titanium layer (not shown) is deposited over the resulting structure and subjected to primary rapid thermal treatment for a short time, to form a quasi-stable titanium silicide (not shown) in which the titanium layer and the silicon of the junction 7 are of C49 structure.

FIG. 3 is a cross section taken after unreacted titanium is etched off, followed by the secondary rapid thermal treatment of the titanium silicide for a short time. As a result, titanium silicides of C54 structure are formed in the surface of the gate electrode 5 and in the surface of the junction 7.

FIG. 4 is a cross section after an interlayer insulating film 9 is formed entirely over the resulting structure.

Referring to FIG. 5, the concentrations of arsenic (As) or boron (B) in the silicide and the well, taken along with line V—V of FIG. 4, are plotted. In this plot, reference character "a" stands for the profile of dopant just after implantation while reference character "b" stands for the profile of dopant just after silicide process and planarization process. On the X-axis, the "c" and "d" points represent the junction depth of 256M DRAM and 1 G DRAM, respectively.

This illustrated formation method of shallow junction has significant problems as follows. Contact resistance increases since the reaction of arsenic (As) or boron (B) ions with titanium restrains the growth of silicide and causes a reduction the dopant concentration at the interface between the titanium silicide and the silicon. Furthermore, a damage to the silicon substrate which is not avoidable upon ion implantation with such conventional methods, causes an increase in the defect density of source/drain, leading to a rise in junction leakage current. Furthermore, it is difficult to obtain a shallow junction owing to the fact that a thermal treatment subsequent to ion implantation causes the dopants to diffuse.

As a consequence, the conventional methods for forming a shallow junction are not efficient for highly integrated semiconductor devices.

SUMMARY OF THE INVENTION

Therefore, it is an objective of the present invention to solve the problems encountered in prior arts and to provide a method for forming a shallow junction of a semiconductor device, whereby a significant improvement can be brought about in the face resistance, contact resistance and leakage current of the junction.

It is another objective of the present invention to provide a method for forming a shallow junction of a semiconductor device, which is efficient for the high integration of a semiconductor device.

In accordance with an aspect of the present invention, a method for forming a shallow junction of a semiconductor device comprises the steps of: providing a silicon substrate in which an element isolating film is formed defining an active region and a field region; forming a first metal film over the resulting structure, said first metal film subject to IV group and having a hexagonal crystal structure; implanting impurities in the first metal layer to form a source/drain junction within the active region of the silicon substrate, said impurities having a conductivity opposite to that of said silicon substrate; forming a second metal film over the resulting structure, said second metal film subject to IV group and having a hexagonal crystal structure; subjecting the first and the second metal films to a first thermal treatment to form a first metal silicide and a second metal silicide in said source/drain junction; removing unreacted parts of the first and the second metal films; and subjecting the first metal silicide and the second metal silicide to a second thermal treatment.

In accordance with another aspect of the present invention, a method for forming a shallow junction of a semiconductor device comprises the steps of: providing a silicon substrate; forming a well on the silicon substrate and an element isolation film, a gate oxide, a gate electrode and a sidewall spacer on the well, in sequence; forming a zirconium film over the resulting structure; implanting impurities in the zirconium film to form a source/drain junction within an active region of the silicon substrate, said impurities having a conductivity opposite to that of said silicon substrate; forming a titanium film over the resulting structure; subjecting said zirconium and titanium films to a first thermal treatment for a few minutes to form a zirconium silicide and a titanium silicide in said source/drain junction; removing unreacted parts of the zirconium and the titanium films; and subjecting the zirconium silicide and the titanium silicide to a second thermal treatment for a few minutes.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENTS

Figure 1:
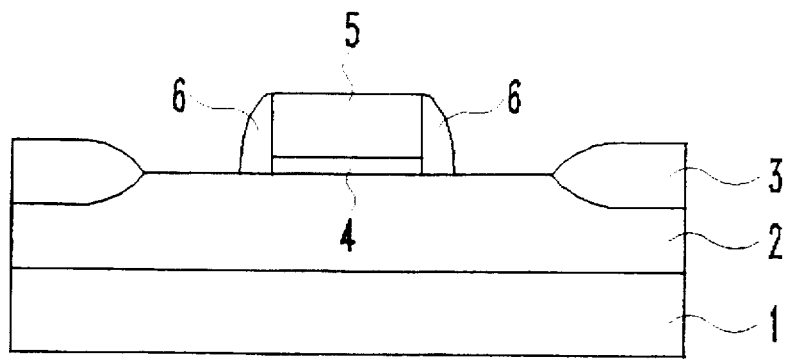
FIGS. 1 through 4 are schematic cross sectional views showing a conventional method for forming a shallow junction of a semiconductor device.
Figure 2:
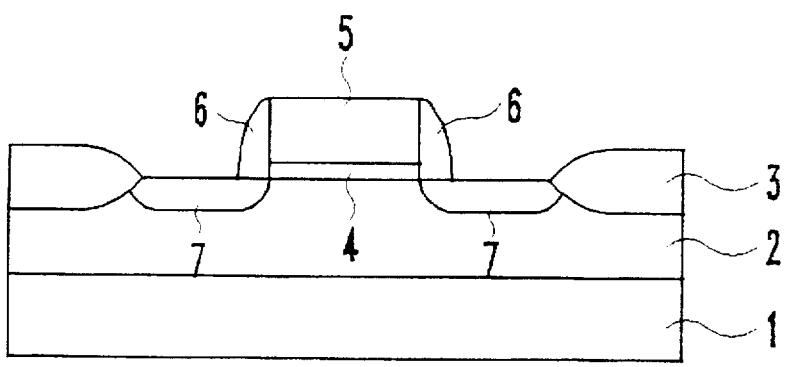
Figure 3:
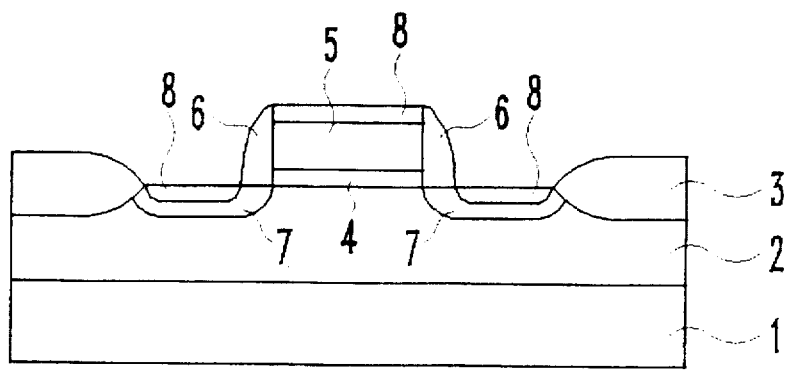
Figure 4:
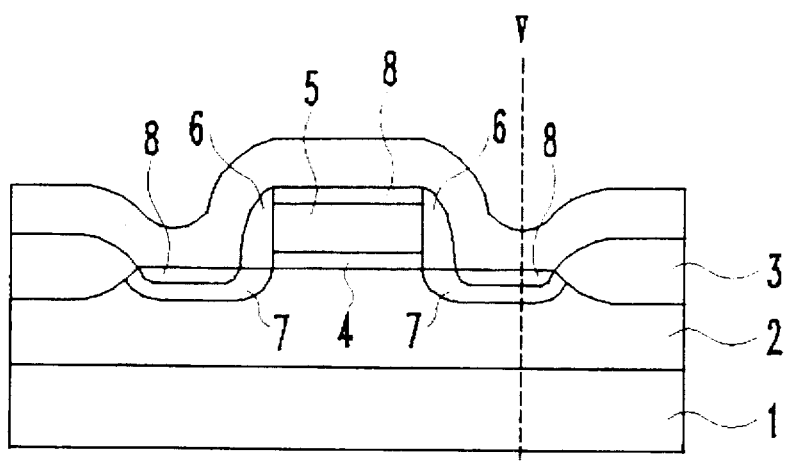
Figure 5:
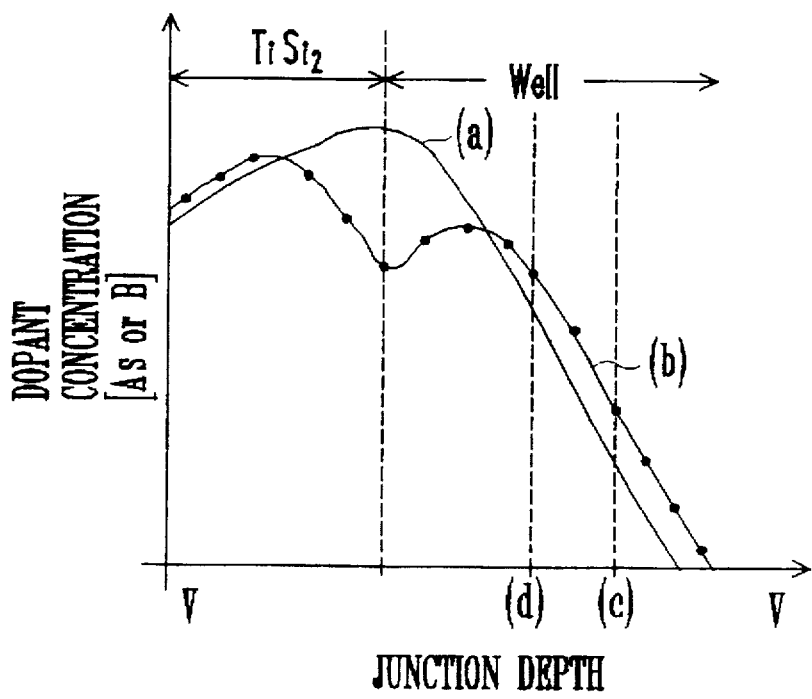
FIG. 5 shows the concentrations of dopant which are plotted with regard to junction depth in silicide and the well, taken along with line V—V of FIG. 4.

The application of the preferred embodiments of the present invention is best understood with reference to the accompanying drawings, wherein like reference numerals are used for like and corresponding parts, respectively.

Referring to FIGS. 6 through 11, processes for forming a shallow junction, according to the present invention are illustrated in schematic form.

Figure 6:
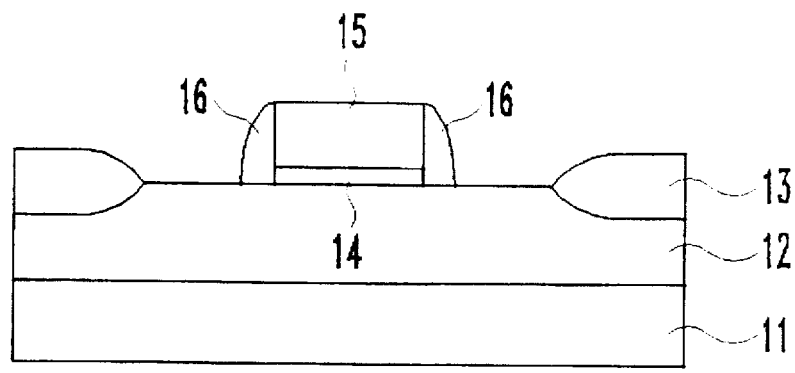
FIGS. 6 through 11 are schematic cross sectional views showing a method for forming a shallow junction of a semiconductor device, according to the present invention.

As shown in FIG. 6, using an ion implantation mask, a well 12 is formed in a predetermined region of a semiconductor substrate 11. Thereafter, an element isolation film 13 is formed in an element isolation region of the well 12, followed by the formation of a gate oxide film 14 over the silicon substrate 11 exposed. A polysilicon layer is deposited over the gate oxide film 14 and selectively etched to form a gate electrode 15 at the side wall at which an oxide spacer 16 is, then, formed. The resulting structure is cleaned with flourohydrogen (HF) in order to prevent contamination of impurity when it is transferred from vacuum into another place in which subsequent processes are carried out.

Figure 7:
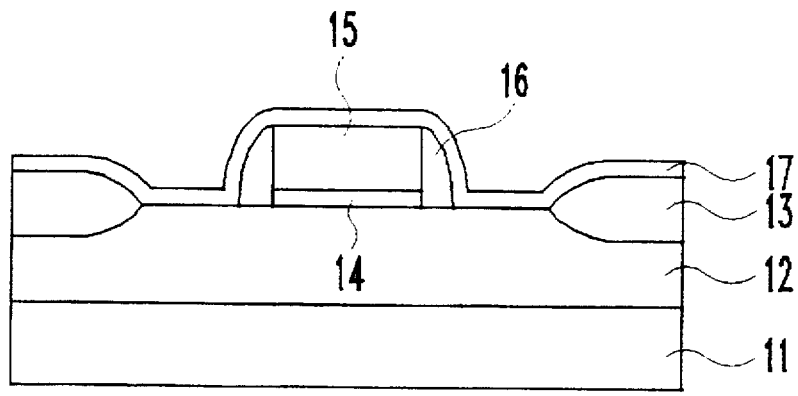

Next, using an RF or DC sputtering process or electron beam deposition process, a zirconium film 17 about 50–200 Angstrom thick is deposited entirely over the resulting structure, as shown in FIG. 7. In place of zirconium film, group IV metal elements with a hexagonal crystal structure may be selectively used to form a depositing film.

When using the sputtering process, a $Zr/Ar(+N_2)$ precursor is employed at a temperature of about 20°–500° C. under a pressure of about 1–100 mtorr. For an electron beam deposition process, highly pure zirconium of 99.0% or higher is evaporated in a high vacuum of $10^{-8}$–$10^{-11}$ torr by an electron beam.

Figure 8:
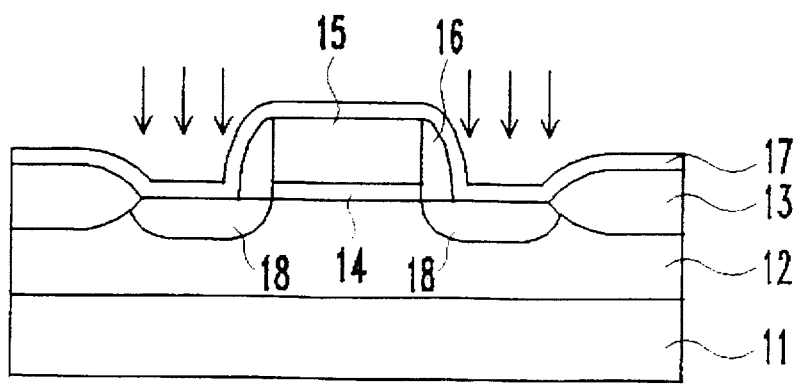

FIG. 8 is a cross section taken after fluoroboron ($BF_2$) or arsenic (As) is selectively implanted in the upper region of the zirconium film 17, to form a source/drain junction 18, followed by cleaning the resulting structure. Instead of fluoroboron or arsenic, impurities selected from group III or group V may be used.

Figure 9:
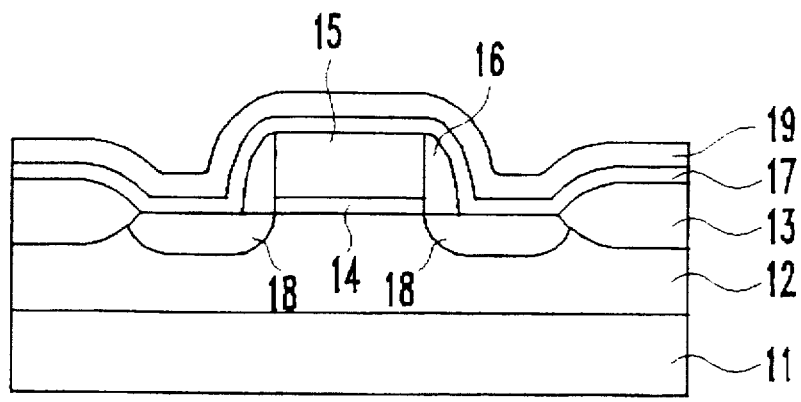

Subsequently, as shown in FIG. 9, a titanium film 19 is deposited at a thickness of about 100–500 Angstrom over the resulting structure, using a sputtering or electron beam depositing process. This sputtering is carried out under the same conditions as those for the zirconium film of FIG. 7, except for using $Ti/Ar(+N_2)$ as a precursor while, if the electron beam depositing process is chosen, the same conditions are used.

Zirconium and titanium, both subject to group IV, have a valence electron structure of $|Ar|3d^24s^2$ and $[Kr]4d^25s^2$, respectively. In addition, zirconium and titanium which have an atomic diameter of 2.0 and 2.1 Angstrom are the same hexagonal crystal structure. Thus, they are bonded to each other without stress at the interface therebetween. In contrast with titanium, zirconium does not react with arsenic or boron.

Next, the zirconium film 17 and the titanium film 19 is subjected to primary rapid thermal treatment for a short time. At this time, the zirconium film 17 reacts with the silicon of the junction 18 to form zirconium silicide (not shown). Using an etchant comprising ammonia water ($NH_4OH$), hydrogen peroxide ($H_2O_2$) and deionized water ($H_2O$) mixed in a ratio of 1:1:5, unreacted titanium film 19 and zirconium film 17 are in part removed.

Figure 10:
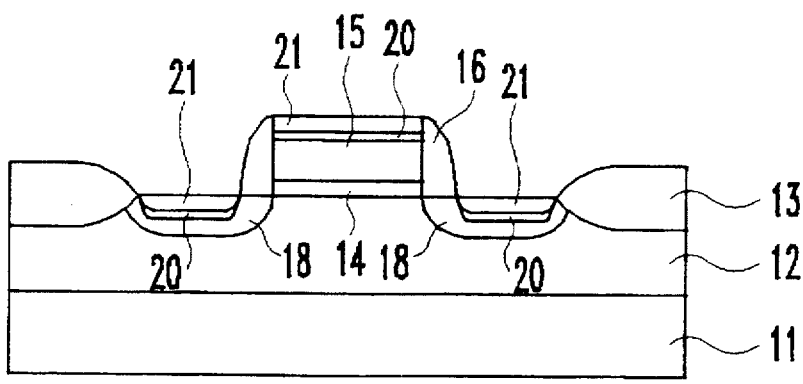
Figure 11:
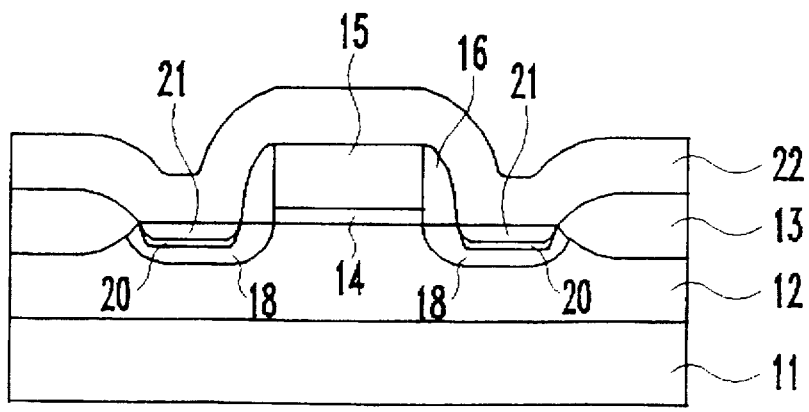

As shown in FIG. 10, the zirconium silicide (not shown) and titanium silicide (not shown), both resulting from the primary rapid thermal treatment, are secondarily thermally treated for a short time to form a zirconium silicide 20 and a titanium silicide 21. In place of the above primary and secondary thermal treatments, primary and secondary furnace anneal processes may be used.

The zirconium silicide 20 has the same C-49 orthorhombic structure as the titanium silicide 21. In grid distances, the zirconium silicide is similar to the titanium silicide, the former having a=3.69 Angstrom, b=14.76 Angstrom and c=3.66 Angstrom and the latter having a=3.62 Angstrom, b=13.76 Angstrom and c=3.60 Angstrom. While the titanium silicide has a great tendency to aggregate by virtue of high surface energy, the zirconium silicide does little owing to low surface energy. Hence, the zirconium silicide 20 plays a role of capping layer over the titanium silicide 21, allowing thermal stability to be secured in subsequent thermal processes. The specific resistances of zirconium silicide, C-49 titanium silicide and C-54 titanium silicide range from 33–42, 65–85 and 13–25μ Ωm, respectively. For schottky barrier, zirconium silicide and titanium silicide show 0.55 eV and 0.6 eV and have relatively high barrier heights in n or p type silicon, allowing an ohm type contact.

Next, on the resulting structure, an interlayer insulating film 11 is deposited and then, planarized by thermal treatment.

As described hereinbefore, zirconium does not form compounds with arsenic or boron, which enables silicide to grow smoothly, reducing the resistance of the junction, according to the method of the present invention. In addition, since boron or arsenic is implanted through the zirconium film into a semiconductor substrate, a shallow junction can be obtained. Furthermore, according to the method of the present invention, the defects attributable to the ion implantation exist within the zirconium film, so that there can be a significant reduction in the defect density in the junction. Furthermore, the role of the zirconium silicide as a capping layer over the titanium silicide allows thermal stability to be obtained in subsequent thermal processes. Also, because the titanium silicide and the zirconium silicide have relatively low barrier heights in n or p type silicon, it is possible to form an ohm type contact in accordance with the method of the present invention.

Taken together, the results demonstrate that the method for forming a shallow junction of a semiconductor device according to the present invention is suitable for the high integration of a semiconductor device.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A method for forming a shallow junction of a semiconductor device, comprising the steps of:

providing a silicon substrate in which an element isolating film is formed defining an active region and a field region;

forming a zirconium film over the silicon substrate;

implanting impurities in the zirconium film to form a source/drain junction within the active region of the silicon substrate, said impurities having a conductivity opposite to that of said silicon substrate;

forming a titanium film over the zirconium film;

subjecting the zirconium and titanium films to a first thermal treatment to form a zirconium silicide and a titanium silicide in said source/drain junction;

removing unreacted parts of the zirconium and the titanium films; and subjecting the zirconium silicide and the titanium silicide to a second thermal treatment.

2. A method in accordance with claim 1, wherein said zirconium film is formed at a thickness of 50–200 Angstrom using an RF or DC sputtering process or an electron beam depositing process.

3. A method in accordance with claim 2, wherein said RF or DC sputtering process is carried out with Zr/Ar or Zr/Ar+$N_2$ precursor at a temperature of 20°–500° C. under a pressure of 1–100 mtorr.

4. A method in accordance with claim 2, wherein said electron beam depositing process is carried out by evaporating zirconium with a purity of 99.0% or higher with electron beams in a ultra vacuum of $10^{-8}$–$10^{-11}$ torr.

5. A method in accordance with claim 1, wherein said titanium film is formed at a thickness of 100–500 Angstrom using an RF or DC sputtering process or an electron beam depositing process.

6. A method in accordance with claim 5, wherein said RF or DC sputtering process is carried out with Ti/Ar or Ti/Ar+$N_2$ precursor at a temperature of 20°–500° C. under a pressure of 1–100 mtorr.

7. A method in accordance with claim 5, wherein said electron beam depositing process is carried out by evaporating titanium with a purity of 99.0% or higher with electron beams in an ultra vacuum of $10^{-8}$–$10^{-11}$ torr.

8. A method in accordance with claim 1, wherein said unreacted parts of said zirconium film and said titanium film are removed using an etchant comprised of ammonia water, hydrogen peroxide and deionized water which are mixed with a ratio of 1:1:5.

9. A method in accordance with claim 1, wherein said first and said second thermal treatments are of RTA treatment or furnace thermal treatment.

10. A method in accordance with claim 1, wherein said silicon substrate is of n type and said impurities are of arsenic or said silicon substrate is of p type and said impurities are of boron.

11. A method in accordance with claim 1, wherein said zirconium film and said titanium film both have the same C-49 orthorhombic structure.

12. A method for forming a shallow junction of a semiconductor device, comprising the steps of:

providing a silicon substrate;

forming a well on the silicon substrate and an element isolation film, a gate oxide, a gate electrode and a sidewall spacer on the well, in sequence;

forming a zirconium film over the resulting structure;

implanting impurities in the zirconium film to form a source/drain junction within an active region of the silicon substrate, said impurities having a conductivity opposite to that of said silicon substrate;

forming a titanium film over the resulting structure;

subjecting the zirconium and the titanium films to a first thermal treatment to form a zirconium silicide and a titanium silicide in said source/drain junction;

removing unreacted parts of the zirconium and the titanium films; and subjecting the zirconium silicide and the titanium silicide to a second thermal treatment.

13. A method in accordance with claim 12, wherein said zirconium film is formed at a thickness of 50–200 Angstrom using an RF or DC sputtering process or an electron beam depositing process.

14. A method in accordance with claim 13, wherein said RF or DC sputtering process is carried out with Zr/Ar or Zr/Ar+N$_2$ precursor at a temperature of 20°–500° C. under a pressure of 1–100 mtorr.

15. A method in accordance with claim 13, wherein said electron beam depositing process is carried out by evaporating zirconium with electron beams in an ultra vacuum of $10^{-8}$–$10^{-11}$ torr.

16. A method in accordance with claim 12, wherein said titanium film is formed at a thickness of 100–500 Angstrom using an RF or DC sputtering process or an electron beam depositing process.

17. A method in accordance with claim 16, wherein said RF or DC sputtering process is carried out with Ti/Ar or Ti/Ar+N$_2$ precursor at a temperature of 200°–500° C. under a pressure of 1–100 mtorr.

18. A method in accordance with claim 16, wherein said electron beam depositing process is carried out by evaporating titanium with electron beams in an ultra vacuum of $10^{-8}$–$10^{-11}$ torr.

19. A method in accordance with claim 12, wherein said unreacted parts of said zirconium film and said titanium film are removed using an etchant comprising of ammonia water, hydrogen peroxide and deionized water which are mixed with a ration of 1:1:5.

20. A method in accordance with claim 12, wherein said first and second thermal treatments are of RTA treatment or furnace thermal treatment.

21. A method in accordance with claim 12, wherein said silicon substrate is of n type and said impurities are of arsenic or said silicon substrate is of p type and said impurities are of boron.

22. A method in accordance with claim 12, wherein said zirconium film and said titanium film both have the same C-49 orthorhombic structure.

\* \* \* \* \*